(12) United States Patent
Wostyn (10) Patent No.: US 11,056,574 B2
(45) Date of Patent: Jul. 6, 2021

(54) STACKED SEMICONDUCTOR DEVICE AND METHOD OF FORMING SAME

(71) Applicant: IMEC vzw, Leuven (BE)

(72) Inventor: Kurt Wostyn, Lubbeek (BE)

(73) Assignee: IMEC vzw, Leuven (BE)

( * ) Notice: Subject to any disclaimer, the term of this patent is extended or adjusted under 35 U.S.C. 154(b) by 32 days.

(21) Appl. No.: 16/696,841

(22) Filed: Nov. 26, 2019

(65) Prior Publication Data
US 2020/0176583 A1 Jun. 4, 2020

(30) Foreign Application Priority Data

Nov. 27, 2018 (EP) ..................................... 18208452

(51) Int. Cl.
| | |
|---|---|
| *H01L 29/66* | (2006.01) |
| *H01L 29/06* | (2006.01) |
| *H01L 29/08* | (2006.01) |
| *H01L 29/161* | (2006.01) |

(52) U.S. Cl.
CPC ...... *H01L 29/6656* (2013.01); *H01L 29/0669* (2013.01); *H01L 29/0847* (2013.01); *H01L 29/161* (2013.01); *H01L 29/66553* (2013.01); *H01L 29/66818* (2013.01)

(58) Field of Classification Search
CPC ............. H01L 29/6656; H01L 29/0669; H01L 29/0847; H01L 29/161; H01L 29/66553; H01L 29/55818
See application file for complete search history.

(56) References Cited

U.S. PATENT DOCUMENTS

| | | | |
|---|---|---|---|
| 5,684,320 A | 11/1997 | Kawashima | |
| 8,293,608 B2 * | 10/2012 | Orlowski | .......... H01L 29/78696 438/285 |
| 9,224,811 B2 | 12/2015 | Cheng et al. | |
| 9,490,323 B2 * | 11/2016 | Rodder | ................ H01L 29/1037 |
| 9,570,551 B1 | 2/2017 | Balakrishnan et al. | |
| 9,570,609 B2 * | 2/2017 | Obradovic | ........ H01L 29/78681 |

(Continued)

OTHER PUBLICATIONS

European Search Report for Application No. EP 18208452.5, dated Jun. 24, 2019, which claims priority of Application No. 18208452.5.

*Primary Examiner* — Mark W Tornow
(74) *Attorney, Agent, or Firm* — Knobbe, Martens, Olson & Bear, LLP (57) ABSTRACT

This disclosed technology generally relates to a semiconductor device. One aspect relates to a method of fabricating a stacked semiconductor including forming a semiconductor structure protruding above the substrate and a gate structure extending across the semiconductor structure. The semiconductor structure includes a lower channel layer formed of a first material, an intermediate layer formed of a second material and an upper channel layer formed of a third material. The method additionally includes forming oxidized end portions defining second spacers on end surfaces of an upper layer. And forming the oxidized end portions comprises oxidizing end portions of the upper channel layer at opposite sides of the gate structure using an oxidization process adapted to cause a rate of oxidation of the third material which is greater than a rate of oxidation of the first material, while first spacers cover intermediate end surfaces.

19 Claims, 4 Drawing Sheets

(56) References Cited

U.S. PATENT DOCUMENTS

| | | | |
|---|---|---|---|
| 9,837,414 | B1 | 12/2017 | Balakrishnan et al. |
| 9,923,055 | B1 | 3/2018 | Cheng et al. |
| 9,954,058 | B1 * | 4/2018 | Mochizuki ........ H01L 29/42392 |
| 9,991,261 | B2 | 6/2018 | Mitard |
| 10,600,889 | B2 * | 3/2020 | Cheng ................ H01L 29/0653 |
| 2015/0311142 | A1 | 10/2015 | Sekar et al. |
| 2015/0311286 | A1 | 10/2015 | Lee et al. |
| 2017/0005188 | A1 | 1/2017 | Cheng et al. |
| 2017/0250250 | A1 | 8/2017 | Bentley et al. |
| 2018/0047832 | A1 | 2/2018 | Tapily et al. |

* cited by examiner

STACKED SEMICONDUCTOR DEVICE AND METHOD OF FORMING SAME

CROSS-REFERENCE TO RELATED APPLICATIONS

This application claims foreign priority to European Application No. EP 18208452.5, filed Nov. 27, 2018, the content of which is incorporated by reference herein in its entirety.

BACKGROUND

Field

The disclosed technology generally relates to semiconductor devices, and more particularly to stacked semiconductor devices, and methods of fabricating same.

Description of the Related Technology

Consumers increasingly demand electronic products having semiconductor devices that are highly integrated for superior performance while remaining relatively inexpensive. Some of the consumer demands may be addressed with continued physical scaling of the semiconductor devices and increase in the density of the semiconductor devices. In some semiconductor devices, e.g., a two-dimensional (2D) or planar semiconductor device, the device density mainly corresponds to the lateral dimensions or the area occupied by a unit cell of the device. With continued scaling to achieve increasingly smaller devices, however, such lateral scaling may eventually become impractical or insufficient to meet the technological needs. This may be because, among other reasons, as the technological node advances, smaller sizes may be achieved at the expense of increasing difficulty and/or cost.

To enable more area and power efficient circuits, three-dimensional (3D) semiconductor devices having vertically arranged cells are receiving increasing attention as an alternative to traditional 2D or planar semiconductor devices. One notable example is stacked transistor devices including, for example, a complementary pair of field effect transistors (FETs) stacked on top of one another. A challenging step in an integration scheme for a stacked transistor pair is separating the source/drain regions of the lower and the upper transistor.

SUMMARY OF CERTAIN INVENTIVE ASPECTS

An objective of the present disclosed concept is to address the afore-mentioned challenge and provide a method enabling separate formation of source/drain regions on stacked lower and upper channel layers. Further and alternative objectives may be understood from the following.

According to an aspect of the present disclosed concept there is provided a method for forming a semiconductor device, the method including: forming on a substrate a semiconductor structure protruding above the substrate and a gate structure extending across the semiconductor structure, the semiconductor structure including a layer stack including a lower channel layer formed of a first material $SiGe_x$, an intermediate layer formed of a second material $SiGe_y$, and an upper channel layer formed of a third material $SiGe_z$, where $0 \le x<z<y$; etching back end surfaces of the intermediate layer exposed at opposite sides of the gate structure to form recesses in the semiconductor structure at opposite sides of the gate structure; depositing in the recesses first spacers on the intermediate layer end surfaces; forming oxidized end portions defining second spacers on end surfaces of the upper layer, where forming the oxidized end portions includes oxidizing end portions of the upper channel layer at opposite sides of the gate structure using an oxidization process adapted to cause a rate of oxidation of the third material which is greater than a rate of oxidation of the first material, where the first spacers covers the intermediate layer end surfaces during the oxidation process, while the first and the second spacers covers the intermediate and upper layer end surfaces, epitaxially growing lower source/drain regions on end surfaces of the lower channel layer exposed at opposite sides of the gate structure, and subsequent to removing the second spacers to expose the end surfaces of the upper channel layer and while the first spacers covers the intermediate layer end surfaces, epitaxially growing upper source/drain regions on the end surfaces of the upper channel layer.

This method enables a selective formation of the first and second spacers on the intermediate and upper channel layer end surfaces. Accordingly, lower source/drain regions may be selectively grown on the end surfaces of the lower channel layer while the first and second spacers counteracts growth on the intermediate and upper channel layer end surfaces. Subsequently, after removing the second spacers, upper source/drain regions may be formed on the upper layer end surfaces.

By a combination of comparably small number of processing steps—recessing of the intermediate layer and first spacer formation on the intermediate layer, and second (oxide) spacer formation on the upper channel layer using a preferential oxidation process—separate processing of lower and upper source/drain regions may occur. Accordingly, the method enables forming of a vertical stack of transistors including a lower transistor and an upper transistor, wherein the lower channel layer and the lower source/drain regions form part of the lower transistor and the upper channel layer and the upper source/drain regions form part of the upper transistor.

In accordance with the method, the first, second and third materials each can include Si and/or Ge, where the third material may have a greater Ge content than the first material (i.e. $0 \le x<z$), and where the second layer may have a Ge content greater than the third material (i.e. $z<y \le 1$). This can enable formation of the recesses by etching the second material selectively to the first and the third materials. The recesses in turn can enable the first spacers to be defined to selectively cover the (etched back) intermediate layer end surfaces (i.e. the first spacers are formed such that the upper and lower channel layer end surfaces are exposed by the first spacers).

The first spacers may act as a mask of the intermediate layer end surfaces during the epitaxial growths of the lower and upper source/drain regions.

The first spacers may further act as a mask of the intermediate layer end surfaces during the oxidation process. This facilitates separate processing of the second (oxide) spacers on the end portions of the upper channel layer. Absence of the first spacers could otherwise have resulted in simultaneous formation of oxide spacers on the intermediate and upper channel layer, rendering a subsequent selective oxide spacer removal step from the upper channel layer considerably more challenging.

As used herein, the labels "lower" and "upper" describe the relative position of the lower and upper layers, i.e. the "lower" layer being a layer formed closer to the substrate than the "upper" layer, as seen in a vertical direction/normal to the substrate. Accordingly, the lower layer need not be a bottom-most layer in the fin structure. Conversely the upper layer need not be a top-most layer of the fin structure.

A Ge-content of the third material $SiGe_z$ may be at least 10 percentage units greater than a Ge-content of the first material $SiGe_x$, and the Ge-content of the second material $SiGe_y$ may be at least 10 percentage units greater than a Ge-content of the third material $SiGe_z$. These relative differences of Ge-content between the layers allows for an advantageous degree of selectivity during the recess formation and the oxidation process.

The first material may be Si (i.e. x=0). Thereby, a lower channel layer of Si and an upper channel layer of SiGe may be provided.

The layer stack of the semiconductor structure may be formed by a stack of nanowires or by a stack of nanosheets. Hence, either nanowire or nanosheet based transistor devices may be formed.

The semiconductor structure may be formed by a portion of semiconductor fin structure remaining under the gate structure following a fin cut process (which also may be referred to as a fin recess process). Accordingly, the formation of first/second spacer and upper/lower source/drain regions may be performed on the end surfaces of the lower, intermediate and upper layers exposed during the fin cut/recess process.

The method may further include: forming an initial semiconductor fin structure protruding above the substrate and including a layer stack including an initial lower layer of the first material, an initial intermediate layer of the second material and an initial upper channel layer of the third material, forming at least one gate structure extending across the initial semiconductor structure, etching through the initial layer stack on opposite sides of each of the at least one gate structure using the at least one gate structure as an etch mask, thereby forming a semiconductor structure under each one of the at least one gate structure, each including a layer stack including a respective lower layer, a respective intermediate layer and a respective upper layer, each layer having end surfaces exposed at opposite sides of a respective one of the at least one gate structures, where recesses, first spacers, second spacers, lower source/drain regions and upper source/drain regions are formed on each one of the at least one semiconductor structures.

Depositing the first spacers may include depositing a first spacer layer covering the semiconductor structure and filling the recesses and thereafter removing first spacer layer portions outside of the recesses by etching the first spacer layer. The recesses may allow the first spacer layer portions deposited within the recesses to be preserved to cover the intermediate layer end surfaces following the etching of the first spacer layer.

The first spacers may be formed of a different material than the second spacers.

The lower source/drain regions may be doped to have a first conductivity type and the upper source/drain regions may be doped to have a second conductivity type, complementary to the first conductivity type. Hence, a stacked complementary pair of transistors (i.e. p/n or n/p) may be formed.

The method may further include covering the lower source/drain regions with a deposited material prior to forming the upper source/drain regions. As will described below, the deposited material may include a conductive material for lower source/drain contacts. However, the deposited material may also be a temporary material layer which may be removed subsequent to forming the upper source/drain regions.

The method may further include, prior to epitaxially growing the upper source/drain regions, forming lower source/drain contacts for the lower source/drain regions. The lower source/drain contacts may be formed on the lower source/drain regions. The lower source/drain contacts may be formed prior to removing the second spacers. Thereby, the second spacers may cover the upper layer end surfaces during the lower source/drain contact formation.

The method may further include forming upper source/drain contacts for the upper source/drain regions. The upper source/drain contacts may be formed on the upper source/drain regions. The upper source/drain contacts may be formed subsequent to forming the lower source/drain contacts.

The method may further include, prior to forming the upper source/drain contacts, forming an insulating capping layer on at least one of the lower source/drain contacts and thereafter forming the upper source source/drain contacts. Thereby a lower source/drain contact may be insulated from an above upper source/drain contact. An insulating capping layer may be formed on only one of the lower source/drain contacts or on both.

The method may further include, subsequent to the oxidation process, performing an oxide etch such that oxide portions on the lower channel layer end surfaces are removed while the upper channel layer end surfaces remain covered by the second spacers. The end surfaces of the lower channel layer may thereby be cleared from oxide prior to the epitaxial growth of source/drain regions. The oxidation process may be performed such that the second (oxide) spacers are not affected appreciably, or such that the second spacers are at least partially preserved, i.e. such that second spacers of a reduced thickness remain on the end surfaces of the upper channel layer.

The method may further include, subsequent to forming the lower and upper source/drain regions, replacing the gate structure with a replacement metal gate structure. Thereby, the replacement metal gate structure may be formed in a self-aligned manner with respect to the channel layers and the source/drain regions.

The method may further include removing the gate structure from the layer stack and thereafter removing the intermediate layer from the layer stack by etching the second material selectively to the first and the third materials. Thereby, the circumferentially extending peripheral surface of the upper channel layer may be exposed. In other words, the upper channel layer may be "released". Subsequent to removing the intermediate layer, a replacement metal structure may be formed on the lower and upper channel layers. This may allow the replacement metal gate structure to be formed to wrap-around the upper channel layer, i.e. a forming gate-all-around (GAA). The intermediate layer may form a sacrificial layer of the layer stack.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

The present disclosure relates to a method for forming a semiconductor device including a vertical stack of transistors. The vertical stack may in particular include a lower transistor such as a lower FET and an upper transistor such as an upper FET, the upper and lower transistors having separately formed source/drain regions. More specifically, the semiconductor device may be formed from a layer stack including lower and upper channel layers and an intermediate layer. First spacers may be formed to selectively cover end surfaces of the intermediate layer. Second spacers may be formed to selectively cover end surfaces of the upper channel layer using an oxidation process oxidizing the upper channel layer material preferentially over the lower channel layer material. Lower source/drain regions may then be formed on exposed end surfaces of the lower channel layer. Following removal of the second spacers upper source/drain regions may be formed on exposed end surfaces of the upper channel layer. A detailed description of such a method will now be given with reference to FIGS. 1-10. It should be noted that in the figures the relative dimensions of the shown elements, in particular the relative thickness of the layers, is merely schematic and may, for the purpose of illustrational clarity, differ from a physical structure.

Figure 1:
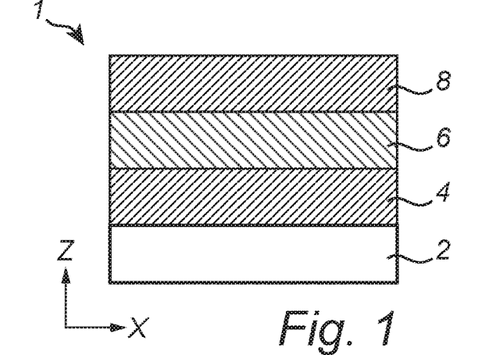
FIGS. 1-10 illustrate intermediate structures at various stages of fabricating a semiconductor device, according to embodiments.
Figure 2:
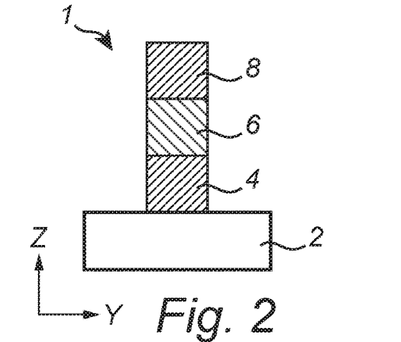

FIGS. 1 and 2 illustrate an initial or intermediate semiconductor fin structure 1. FIG. 1 is a sectional view of a portion of the fin structure 1 along a first horizontal direction X. FIG. 2 is a cross-sectional view of the fin structure 1 taken along second horizontal direction Y. The fin structure 1 is formed on a substrate 2. The fin structure 1 protrudes above the substrate 2 along a vertical direction Z, representing a normal direction to a main surface of the substrate 2. The substrate 2 may be a substrate suitable for complementary metal-oxide semiconductor (CMOS) processing. The substrate 2 may for instance be a semiconductor substrate such as a Si substrate, a germanium (Ge) substrate or a silicon-germanium (SiGe) substrate. Other examples include a silicon-on-insulator (SOI) substrate, a germanium-on-insulator (GeOI) substrate or a silicon-germanium-on-insulator (SiGeOI) substrate. The fin structure 1 protrudes above the substrate 2. The fin structure 1 may be an elongated semiconductor structure extending in parallel to the horizontal direction X. The longitudinal direction of the fin structure 1 may coincide with a first fin track. Although reference in the following will be made to a single fin structure 1, as may be appreciated by a person of ordinary skill in the art that there may typically be a plurality of further fin structures on the substrate 2, which correspond to and extend parallel to the fin structure 1 along a respective fin track. Each of the fin structures may be processed in parallel in a corresponding manner, as will be described in the following.

The fin structure 1 includes a layer stack including an initial lower layer 4, an initial intermediate layer 6 and an initial upper channel layer 8. The lower layer 4 may be a layer from which one or more lower channel layers 14 are to be formed. The intermediate layer 6 may be a sacrificial layer which will be removed after forming the lower and upper source/drain regions. The upper layer 8 may be a layer from which one or more upper channel layers 18 are to be formed. The lower layer 4 is formed of a first semiconductor material. The lower layer 4 may be formed by an individual semiconductor layer on a semiconductor layer of the substrate, or by the semiconductor layer of a semiconductor-on-insulator-type of substrate. The lower layer 4 need however not be formed of a separate layer on top of the substrate 2. Rather, the lower layer 4 may be formed by an upper thickness portion of a semiconductor layer of the substrate 1. The intermediate layer 6 can be formed of a second semiconductor material. The upper layer 8 can be formed of a third semiconductor material. The first, second and third materials each can include Si and/or Ge wherein the third material has a greater Ge content than the first material and the second layer has a Ge content greater than the third material. More specifically, the first material may include $Si_{1-x}Ge_x$, the second material may include $Si_{1-y}Ge_y$, and the third material may include $Si_{1-z}Ge_z$, wherein $0 \leq x < z$ and $z < y \leq 1$. Various compositions of the first through third materials are possible. For instance, a Ge-content of the third material may be at least 10 percentage units greater than a Ge-content of the first material, and the Ge-content of the second material may be at least 10 percentage units greater than a Ge-content of the third material. As a non-limiting example, the first through third materials may have the following composition: x=0, y=0.5 and z=0.25.

Although the layer stack of the illustrated structure 1 comprises three layers, it is appreciated that the layer stack may include a greater number of layers. For instance, the lower channel layer 4 may be supported by an underlying sacrificial layer, formed of a same material as the intermediate layer 6. Thereby, as may be better understood from the following, a wrap-around-gate may be formed for both the lower and upper channel layers/transistors. According to a further variation, a layer stack of a fin structure may include a repetitive sequence of a sacrificial layer and a channel layer, wherein each (first) channel layer which is to be provided with source/drain regions of a first conductivity type (e.g. n- or p-type) may be formed by the first material and each (second) channel layer which is to be provided with source/drain regions of a second complementary conductivity type (e.g. p- or n-type) may be formed by the third material.

The fin structure 1 may be formed using a fin-formation technique. For instance, fin-formation may include patterning a plurality of parallel fins in an epitaxial layer stack (e.g. including a lower epitaxial layer of the first material, an intermediate epitaxial layer of the second material and an upper epitaxial layer of the third material) by etching trenches in the epitaxial layer stack. Either single- or multiple-patterning techniques may be employed, e.g. self-aligned double patterning (SADP) or quadruple patterning (SAQP). A trench isolation or shallow trench isolation (STI) may subsequently be deposited in the trenches on opposite sides of each fin structure 1. By way of example, the fin structures 1 may be formed with a height of 10-100 nm above the substrate 2 or above the shallow trench isolation (STI). A separation between the fin structures 1 may be on the order of tens of nanometers.

Figure 3:
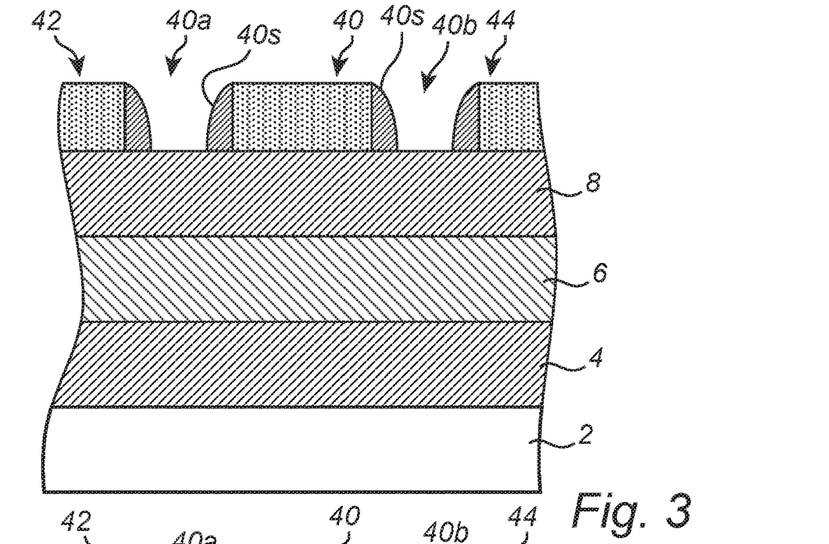

With reference to FIG. 3, a set of gate structures 40, 42, 44 have been formed to extend across the initial fin structure 1. The gate structures 40, 42, 44 may form a respective dummy or sacrificial gate structure, intended to be replaced with a final gate electrode at a later stage. A dummy gate structure may include a dummy gate of a dummy material such as polysilicon or amorphous silicon. As indicated for the gate structure 40, a pair of gate spacers 40s may be formed on opposite sides 40a, 40b of each gate structure 40, e.g., on opposite sidewalls of the dummy or sacrificial gate structure. The gate spacers may be formed of a dielectric material, for instance an oxide- or nitride-material such as SiO$_2$, SiN, SiOC or SiOCN, to name a few non-limiting examples. Additionally, although omitted from FIG. 3 for purpose of illustrational clarity, each gate structure 40, 42, 44 may further comprise a dummy or sacrificial dielectric between the fin structure 1 and the dummy gates. The dummy or sacrificial dielectric may for instance be an oxide such as SiO$_2$, conformally deposited to cover the fin structure 1. Further each gate structure 40, 42, 44 may comprise a respective gate cap covering/capping an upper surface of the dummy gate. The gate caps may for instance be formed by SiN or some other hard mask material.

The gate structures 40, 42, 44 may be formed by depositing a dummy gate material layer to cover the fin structure 1 (or each of the plurality of fin structures as the case may be). The dummy gate material may for instance be chemical vapor deposition (CVD) deposited polysilicon or amorphous silicon. The dummy gate material layer deposition may be preceded by an atomic layer deposition (ALD) of a dummy dielectric layer. Dummy gates may thereafter be formed by patterning the dummy gate material layer by etching trenches in the dummy gate layer, the trenches extending in a direction across the one or more fin structures 1, i.e. along the second horizontal direction Y. Dummy gate patterning may comprise depositing and patterning a hard mask layer above the dummy gate layer using either single- or multiple-patterning techniques. The dummy gate layer may thereafter be etched using the patterned hard mask layer as an etch mask. For instance, a fluorine- or chloride-based wet-etch process or a dry-etch process such as reactive ion etching (RIE) may be used. Hard mask layer portions on the patterned fins may be preserved to form the gate caps on the upper surface of the dummy gates. Gate spacers 40s may subsequently be formed through conformal spacer layer deposition (e.g., by ALD) followed by a vertical anisotropic etch such that spacer layer portions covering horizontal surfaces are removed while spacer layer portions covering vertical surfaces remain following the etch.

Subsequent to forming the gate structures 40, 42, 44, the gate structures 40, 42, 44 may be embedded in an interlayer dielectric (ILD) layer (e.g., of SiO$_2$ or some other conventional a low-k dielectric). The ILD material may be deposited by CVD, planarized (e.g. by chemical mechanical polishing, CMP) and/or etched back such that upper surfaces of the gate structures 40, 42, 44 are exposed.

Figure 4:
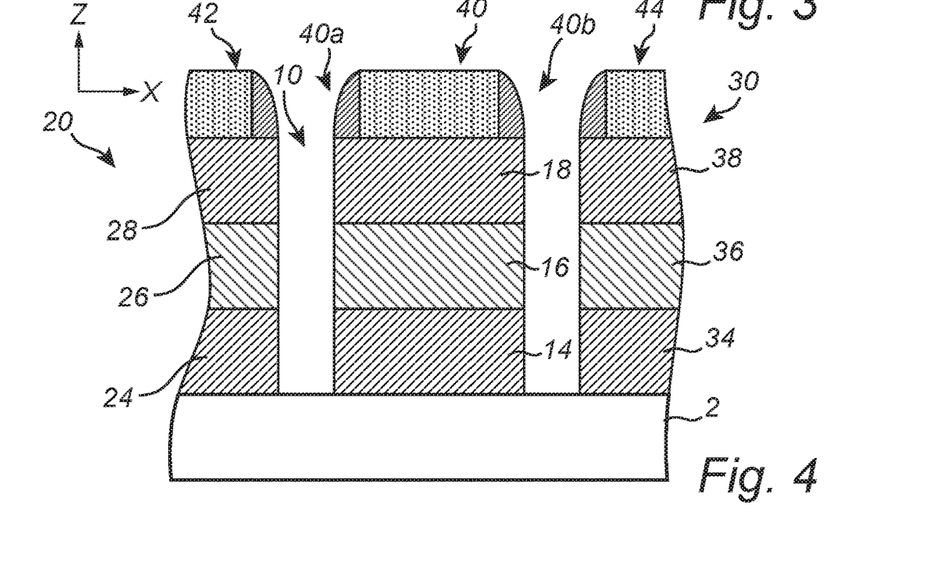

As shown in FIG. 3, the fin structure 1 is exposed on opposite sides 40a, 40b of the gate structure 40 (and correspondingly on opposite sides of each gate structure 42, 44). In FIG. 4, the initial fin structure 1 has been subjected to a "fin cut" process, thereby forming a respective semiconductor structure 10, 20, 30 remaining under each gate structure 40, 42, 44. The fin cut process may comprise etching through the layer stack of the initial fin structure 1 on opposite sides of each of each gate structure 40, 42, 44 using the gate structures 40, 42, 44 as an etch mask. Each semiconductor structure comprises a respective layer stack comprising a lower layer 14, 24, 34, an intermediate layer 16, 26, 36 and an upper layer 18, 28, 38.

If the gate structures 40, 42, 44 are embedded in an interlayer dielectric (ILD) layer the fin cutting may be preceded by first opening the ILD layer on opposite sides 40a, 40b of each gate structure 40, 42, 44 to expose portions of the fin structure 1 using a dielectric etch. The formed openings may be referred to as source/drain trenches in the ILD. Any dummy dielectric covering the portions of the fin structure 1 may also be removed by etching to lay bare the peripheral surfaces of the portions of the fin structure 1 to be removed.

In the following, reference will be made mainly to the semiconductor structure 10. However, the discussion applies correspondingly to any further semiconductor structure such as the structures 20, 30. The semiconductor structure 10 protrudes above the substrate 2. The semiconductor structure 10 presents a pair of end surfaces exposed at opposite sides 40a, 40b of the gate structure 40. The end surfaces of the semiconductor structure 10 are formed by respective end surfaces of each one of the layers 14, 16, 18, exposed at opposite sides of the gate structure 40. The gate structure 40 extends across the semiconductor structure 10 covers the sidewall surfaces and upper surface of the semiconductor structure 10. The layer stack of the semiconductor structure 10 may be formed by either a stack of nanowire-shaped or nanosheet-shaped layers, depending on a ratio of a width dimension (along direction Y) and length dimension (along direction X) of the fin structure 10.

Figure 5:
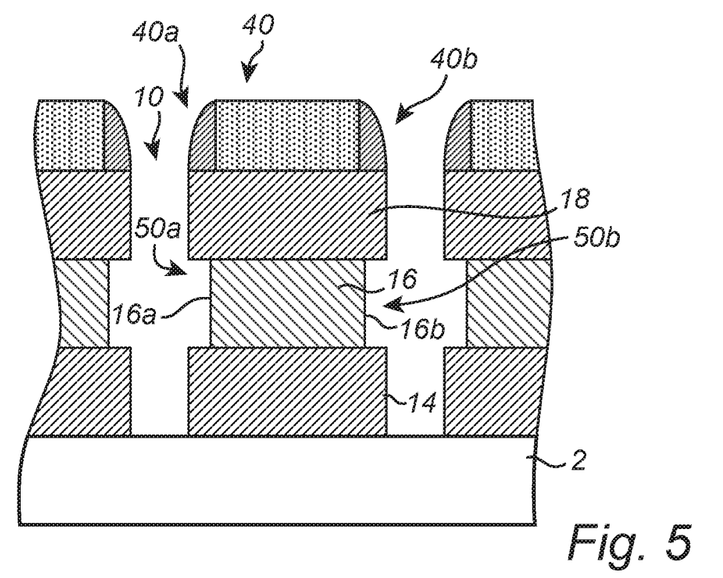

In FIG. 5, end surfaces 16a, 16b of the intermediate layer 16 exposed at opposite sides of the gate structure 40 have been etched back. Thereby, recesses or recessed spaces 50a, 50b have been formed in the semiconductor structure 10, more specifically in the end surfaces thereof. As indicated in FIG. 5, corresponding recesses may be formed in the further semiconductor structures 20, 30. The recesses 60 may for instance be formed with a (horizontal) depth in the range of 5-10 nm. The etch back may comprise using an etch process adapted to etch material having a greater Ge content selectively to materials having a lower Ge content. Since the intermediate layer 16 is formed with a greater Ge content than the lower and upper channel layers 14, 18 the end surfaces 16a, 16b of the intermediate layer 16 may be etched back in relation to end surfaces of the lower and upper channel layers 14, 18. Either wet or dry etching chemistries may be used. For instance, an HCl-based vapor etch may be used. For example, an intermediate layer 16 with 10 percentage units (or more) greater Ge-content than the lower and upper channel layers 14, 18 enables HCl etching of the intermediate layer 16 at a rate which is at least an order of magnitude greater than the lower and upper channel layers 14, 18. Greater difference in Ge-content between the intermediate layer 16 and the upper and lower upper channels 14, 18 enable even greater degree of etch selectivity.

Accordingly, as used herein, a selective etching or removal of a feature "A", relative to a feature "B", is hereby meant that a feature A arranged adjacent to a feature B may be removed while preserving the feature B. Depending on a relative etch rate of the feature A and feature B, the preservation of the feature B following the etch process may be complete (in the sense that the feature B is not affected appreciably during the etch process) or at least partial (in the sense that the feature B remains at least to the extent that it may serve its intended function during subsequent process steps). A ratio of an etch rate of the material of feature A compared to an etch rate of the material of feature B may advantageously be 2:1 or higher, 10:1 or higher, or 40:1 or higher.

Figure 6:
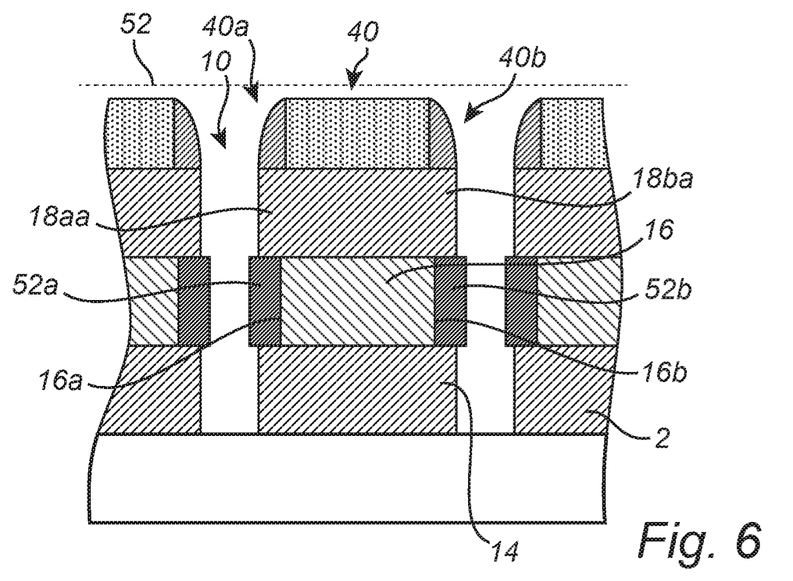

In FIG. 6, first spacers 52a, 52b have been formed in the recesses 50a, 50b. The first spacers 52a, 52b are formed on the (etched back) end surfaces 16a, 16b of the intermediate layer 16. The first spacers 52a, 52b accordingly cover or cap the end surfaces 16a, 16b of the intermediate layer 16. The first spacers 52a, 52b may for instance be oxide spacers or nitride spacers, or some other dielectric spacers. For instance, the first spacers 52a, 52b may be formed by any of the materials mentioned in connection with the gate spacer of the dummy gate structure.

Forming the first spacers 52a, 52b may include depositing a first spacer layer 52 (indicated by dashed signs in FIG. 6) covering the semiconductor structure 10 and filling the recesses 50a, 50b. For instance, the spacer layer 52 may be deposited using ALD. The spacer layer 52 may subsequently be etched to remove first spacer layer portions outside of the recesses 50a, 50b. Either an isotropic oxide etch or a vertical anisotropic oxide etch may be employed. The recesses 52a, 52b can allow first spacer layer portions deposited within therein to be preserved on the intermediate layer end surfaces 16a, 16b.

Figure 7:
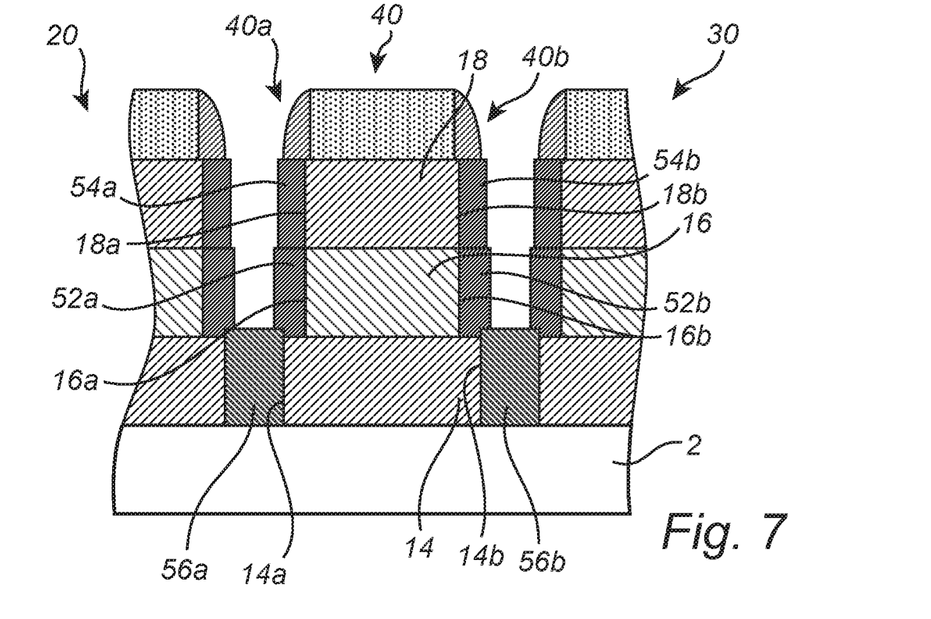

In FIG. 7, second spacers 54a, 54b have been defined on end surfaces 18a, 18b of the upper channel layer 18, on opposite sides of the gate structure 40. End portions of the upper channel layer 18 may be oxidized by exposing the semiconductor structure 1 to an oxidation process. Due to the higher Ge-content of the upper channel layer 18 compared to the Ge content of the lower channel layer 14, the oxidation process may cause oxidation of the upper channel layer 18 at a greater rate than the lower channel layer 14. During the oxidation process, the first spacers 52a, 52b covers the end surfaces 16a, 16b of the intermediate layer 16. Meanwhile, the gate structure 40 covers the lateral/sidewall surfaces and upper surface of the semiconductor structure 1. Hence, of all peripheral surfaces of the semiconductor structure 10, only the end surfaces of the lower channel layer 14 and the upper channel layer 18 may be exposed during the oxidation process. Thereby, a selective or at least preferential oxidation of the end portions of the upper channel layer 18 may result. For instance, a low temperature steam oxidation may enable a selective or preferential oxidation of an upper channel layer with a greater Ge-content than a lower channel layer. For instance, a 5-10 nm thick oxide may be obtained using a steam anneal at about 400° C. for about 30 minutes. By increasing the anneal temperature the duration may be reduced.

Following the oxidation process, oxide portions may have been formed also on end surfaces 14a, 14b of the lower channel layer 14. Prior to further processing, an oxide etch may be performed such that the lower channel layer end surfaces 14a, 14b are cleaned from oxide, for instance using an HF-etch or buffered HF-etch. As may be appreciated, such an oxide etch may cause a slight etch back of the second spacers 54a, 54b, and also of the first spacers 52a, 52b if they are oxide-based. However, the second spacers 54a, 54b (and the first spacers 52a, 52b) may be formed with a greater thickness (e.g., along direction X) than oxide portions on the lower channel end surfaces 14a, 14b. Hence, by limiting a duration of the oxide etch the lower channel layer end surfaces 14a, 14b may be cleaned from oxide while second spacers 54a, 54b (and first spacers 52a, 52b) may be preserved on the respective end surfaces following the oxide etch, at least with a (slightly) reduced thickness. More specifically, the duration may be limited such that the etch is stopped when or shortly after the lower channel end surfaces 14a, 14b have been cleaned of oxide.

Subsequent to the second spacer formation 54a, 54b lower source/drain regions 56a, 56b may be epitaxially grown on the end surfaces 14a, 14b of the lower channel layer 14 exposed at opposite sides 40a, 40b of the gate structure 40. During the epitaxial process, the first spacers 52a, 52b covers the end surfaces 16a, 16b of the intermediate layer 16. The second spacers 54a, 54b covers the end surfaces 18a, 18b of the upper channel layer 18. Meanwhile, the gate structure 40 covers the lateral/sidewall surfaces and upper surface of the semiconductor structure 1. Hence, of all peripheral surfaces of the semiconductor structure 10, only the lower channel layer end surfaces 14a, 14b may be exposed during the epitaxy process. Thereby the source/drain regions 56a, 56b may be selectively grown on the lower channel layer end surfaces 14a, 14b.

For instance, Si or SiGe selective area epitaxy may be performed on the end surfaces 14a, 14b, in accordance with the material of the lower channel layer 14. The source/drain regions 56a, 56b may be doped in accordance with the desired conductivity type, for instance through in-situ doping as per se is known in the art. Alternatively or additionally, implantation doping or diffusion doping may also be employed. In FIG. 7, the source/drain regions 56a, 56b are indicated in a highly schematic manner and may in practice present a geometry dependent on the orientation of the growth surfaces provided by the lower channel layer 14. As indicated in FIG. 7, the epitaxy may be performed such that the source/drain regions 56a, 56b merge with source/drain regions grown on lower channel end surfaces of adjacent semiconductor structures 20, 30. This may however be varied as desired, for instance depending on end-to-end spacing between adjacent semiconductor structures.

Figure 8:
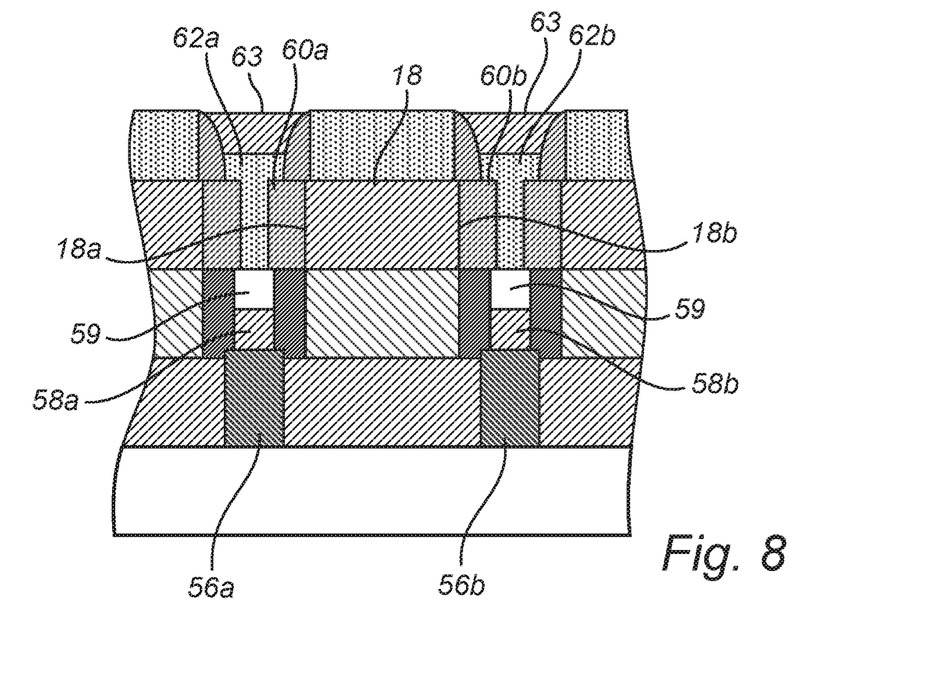

With reference to FIG. 8, subsequent to forming the lower source/drain regions 56a, 56b, lower source/drain contacts 58a, 58b for the lower source/drain regions 56a, 56b may be formed. A lower source/drain contact 58a, 58b may be formed on and in contact with each lower source/drain region 56a, 56b.

The source/drain contacts 58a, 58b may be formed by depositing one or more conductive materials on the source/drain regions 56a, 56b. For instance, a metal such as Ti, TiN, WN, or an alloy of two or more thereof, may be deposited by ALD, CVD or physical vapor deposition (PVD). Optionally, a further material of for instance W, Co, Ni, Ru or an alloy of two or more thereof, may be also deposited as a fill material. The contact material(s) may be deposited to cover the source/drain regions 56a, 56b and subsequently be etched back (possible preceded by CMP) and if desired also patterned to form source/drain contacts 58a, 58b of desired vertical and lateral dimensions.

Alternatively, prior to depositing conductive materials on the lower source/drain regions 56a, 56b, an ILD may be deposited in the source/drain trenches, embedding the gate structures 40, 42, 44. Contact trenches exposing the lower source/drain regions 56a, 56b may be patterned in the deposited ILD. The conductive material may then be deposited in the contact trenches on the exposed lower source/drain regions 56a, 56b and subsequently be etched back (possibly preceded by CMP) to form lower source/drain contacts 58a, 58b of desired vertical and lateral dimensions.

Prior to forming upper source/drain regions and upper source/drain contacts, as will be set out below, an insulating capping layer 59 may be formed on one or both of the lower source/drain contacts 58a, 58b. An insulating capping layer 59 may serve to define electrically separate lower and upper source/drain contacts. For instance, for a CMOS-inverter the n- and p-type FETs have inner electrically common drains but electrically separate sources (e.g. connected to a pull-up and pull-down rail respectively). An insulating capping layer 59 may accordingly be formed at the side of the semiconductor structures which is to serve as the output node of the inverter. The capping layer 59 may for instance be formed by an oxide (such as $SiO_2$), a nitride-based material (such as SiN) or some other low-k dielectric material.

Following formation of lower source/drain contacts 58a, 58b and insulating capping layer 59, the second spacers 54a, 54b may be removed to expose the end surfaces 18a, 18b of the upper channel layer 18. The second spacers 54a, 54b may for instance be removed using an oxide etch. Upper source/drain regions 60a, 60b may thereafter be epitaxially grown on the end surfaces 18a, 18b of the upper channel layer 18. During the epitaxial process, the first spacers 52a, 52b covers the end surfaces 16a, 16b of the intermediate layer 16. Additionally, the lower source/drain regions 56a, 56b are covered by the lower source/drain contacts 58a, 58b, and if applicable also any insulating capping layer 59. Meanwhile, the gate structure 40 covers the lateral/sidewall surfaces and upper surface of the semiconductor structure 1. Hence, of all peripheral surfaces of the semiconductor structure 10, only the upper channel layer end surfaces 18a, 18b may be exposed during the epitaxy process. Thereby the source/drain regions 60a, 60b may be selectively grown on the upper channel layer end surfaces 18a, 18b.

For instance, SiGe selective area epitaxy may be performed on the end surfaces 14a, 14b, in accordance with the material of the lower channel layer 14. Similar to the lower source/drain regions 56a, 56b, the upper source/drain regions 60a, 60b may be doped (e.g. in-situ doped and/or by implantation doping or diffusion doping) in accordance with the desired conductivity type, e.g. complementary to that of the lower source/drain regions. The epitaxy may be performed such that the source/drain regions 60a, 60b either remain separate from source/drain regions grown on upper channel end surfaces of adjacent semiconductor structures 20, 30. It is however also possible to grow the upper source/drain regions such that they merge with upper source/drain regions of adjacent semiconductor structures 20, 30.

As further shown in FIG. 8, the method further comprises forming upper source/drain contacts 62a, 62b for the upper source/drain regions 60a, 60b. An upper source/drain contact 62a, 62b may be formed on and in contact with each upper source/drain region 60a, 60b.

The upper source/drain contacts 62a, 62b may be formed in a manner analogous to the lower source/drain contacts, 58a, 58b. Conductive material may be deposited to cover the source/drain regions 60a, 60b and subsequently be etched back (possibly preceded by CMP) and if desired also patterned to form source/drain contacts 62a, 62b of desired vertical and lateral dimensions. Alternatively, an ILD may (again) be deposited in the source/drain trenches, embedding the gate structures 40, 42, 44. Contact trenches exposing the upper source/drain regions 60a, 60b may be patterned in the deposited ILD. Conductive material may then be deposited in the contact trenches on the exposed upper source/drain regions 60a, 60b and subsequently be etched back (possibly preceded by CMP) to form upper source/drain contacts 62a, 62b of desired vertical and lateral dimensions. As shown in FIG. 8, an upper insulating contact capping layer 63 may subsequently be formed on the upper source/drain contacts 62a, 62b, for instance of any of the materials mentioned in connection with the insulating capping layer 59.

According to an alternative contact-formation scheme, the lower source/drain regions 56a, 56b may instead be covered by an ILD or some other temporary material during the formation of the upper source/drain regions 60a, 60b. The temporary material may thereafter be removed wherein the method may proceed with lower source/drain contact formation, for instance by: depositing conductive material on the lower source/drain regions 56a, 56b; and removing any conductive material deposited on the upper source/drain regions 60a, 60b by etching back the conductive material and optionally also patterning the conductive material. An insulating capping layer 59 may subsequently be formed on one or more lower source/drain contacts 58a, 58b. The method may then proceed with upper source/drain contact formation as set out above.

Figure 9:
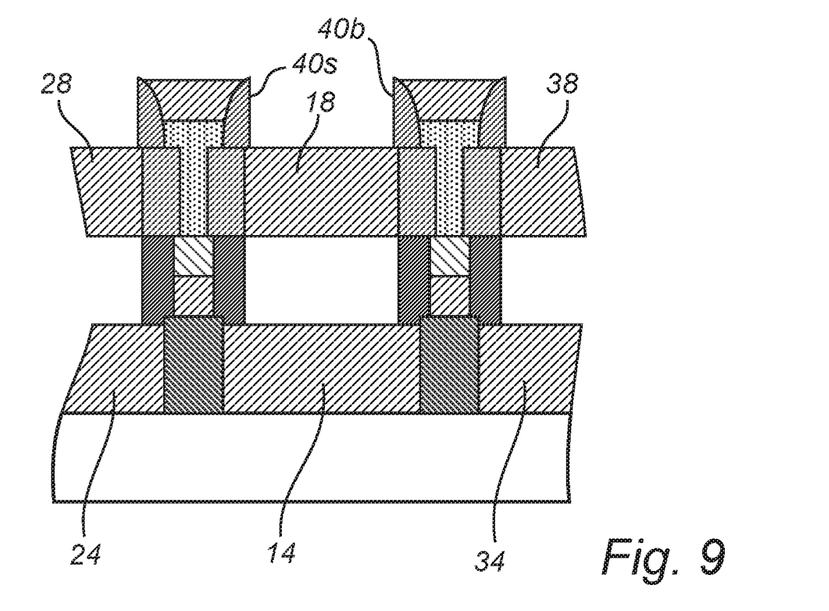

In FIG. 9, the gate structures 40, 42, 44 have been removed from the respective semiconductor structures 10, 20, 30. The lateral/sidewall surfaces of the respective intermediate layers 16, 26, 36 are thereby exposed. The lower and upper channel layers 14, 18 may thereafter be released by removing the intermediate layers 16, 26, 36 from the respective semiconductor structures 10, 20, 30 by etching the second material selectively to the first and the third materials. Any of the etching chemistries discussed in connection with the recess formation may be used. Accordingly, following the removal of the intermediate layer 16 the lateral/sidewall surfaces and the upper surface of the lower channel layer 14 may be exposed. Further, the lateral/sidewall surfaces and the upper and lower surfaces of the upper channel layer 14 may be exposed. Hence, the upper channel layer 18 becomes suspended above the lower channel layer 14. This applies correspondingly to the lower and upper channel layers 24, 34, 28, 38 of the further semiconductor structures 20, 30.

Removing the gate structures 40, 42, 44 may comprise opening the gate caps to expose the upper surfaces of the dummy gates, followed by a dummy gate material etch. Subsequently, any dummy dielectric portions exposed following the dummy gate removal may be removed in an appropriately selected dielectric etch. As shown in FIG. 9, the gate spacers 40s may be preserved.

Figure 10:
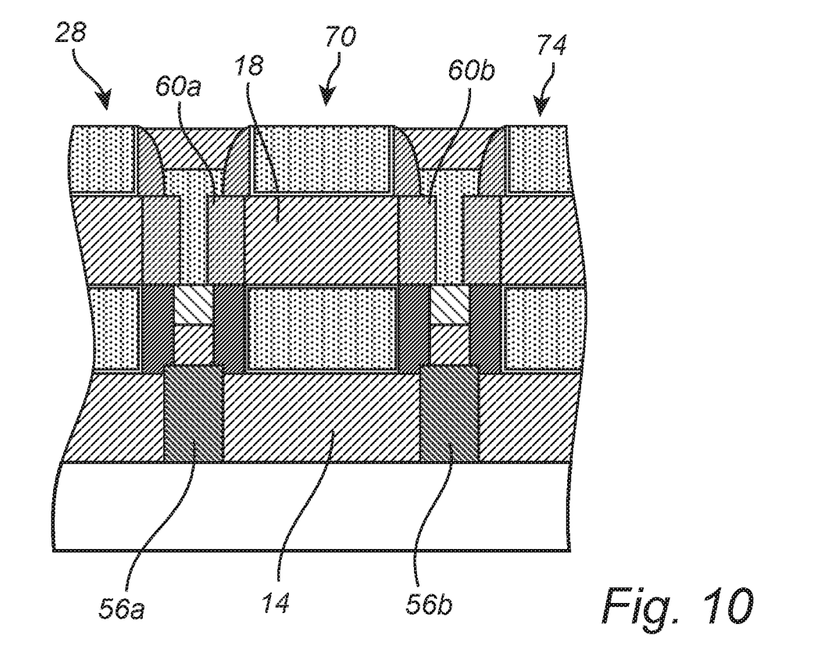

With reference to FIG. 10, the gate structures 40, 42, 44 have been replaced with a respective replacement metal gate structure 70, 72, 74. Each gate structure 70, 72, 74 may include a gate electrode and a gate dielectric. The gate electrode may be formed of one or more metals such as TiN, TaN, TiTaN, Al, TiAl, TiC, TiAlC, or suitable combinations or stacks thereof. The metals may be deposited for instance by ALD or CVD. The gate dielectric may be formed by one or more high-k dielectrics such as $HfO_2$, $ZrO_2$, $Al_2O_3$, to name a few. The gate dielectric may be deposited by ALD. The semiconductor device may subsequently be subjected to further processing, such as back-end-of-line (BEOL) processing, to integrate the transistor stacks in a functioning circuit.

Accordingly, the semiconductor device shown in FIG. 10 includes a lower FET transistor comprising the lower channel layer 14 extending between the lower source/drain regions 56a, 56b and an upper FET transistor comprising the upper channel layer 18 extending between the upper source/drain regions 60a, 60b. The lower and upper FETs include a common gate structure including a gate electrode circumferentially enclosing the lower channel layer 14 (at least partially) and circumferentially enclosing the upper channel layer 18 completely.

In the above the inventive concept has mainly been described with reference to a limited number of examples. However, as is readily appreciated by a person skilled in the art, other examples than the ones disclosed above are equally possible within the scope of the disclosed technology, as defined by the claims.

What is claimed is:

1. A method of forming a semiconductor device, the method comprising:
    forming a semiconductor structure protruding above a substrate and a gate structure extending across the semiconductor structure, wherein the semiconductor structure comprises a layer stack, wherein the layer stack comprises a lower channel layer formed of a first material comprising $SiGe_x$, an intermediate layer formed of a second material comprising $SiGe_y$, and an upper channel layer formed of a third material comprising $SiGe_z$, wherein $0 \leq x < z < y$;

etching back end surfaces of the intermediate layer exposed at opposite sides of the gate structure to form recesses in the semiconductor structure at opposite sides of the gate structure;

depositing first spacers in the recesses, wherein the first spacers are formed on the intermediate layer end surfaces;

forming oxidized end portions defining second spacers on end surfaces of the upper channel layer, wherein forming the oxidized end portions comprises oxidizing end portions of the upper channel layer at opposite sides of the gate structure using an oxidization process adapted to cause a rate of oxidation of the third material which is greater than a rate of oxidation of the first material, wherein the first spacers cover the intermediate layer end surfaces during the oxidation process;

epitaxially growing lower source/drain regions on end surfaces of the lower channel layer exposed at opposite sides of the gate structure, while the first spacers cover the intermediate layer end surfaces and the second spacers cover the end surfaces of the upper channel layer;

removing the second spacers to expose the end surfaces of the upper channel layer;

epitaxially growing upper source/drain regions on the end surfaces of the upper channel layer, subsequent to removing the second spacers and while the first spacers cover the intermediate layer end surfaces;

forming lower source/drain contacts for the lower source/drain regions and/or forming upper source/drain contacts for the upper source/drain regions prior to epitaxially growing the upper source/drain regions; and forming an insulating capping layer on at least one of the lower source/drain contacts prior to forming the upper source/drain contacts.

2. The method of claim 1, wherein depositing the first spacers comprises depositing a first spacer layer covering the semiconductor structure and filling the recesses in the semiconductor structure and removing first spacer layer portions outside of the recesses by etching the first spacer layer.

3. The method of claim 1, wherein the first spacers are formed of a different material than the second spacers.

4. The method of claim 1, wherein the lower source/drain regions are doped with dopants having a first conductivity type and the upper source/drain regions are doped with dopants having a second conductivity type, complementary to the first conductivity type.

5. The method of claim 1, further comprising performing an oxide etch, subsequent to the oxidation process, such that oxide portions on the lower channel layer end surfaces are removed while the upper channel layer end surfaces remain covered by the second spacers.

6. The method of claim 1, further comprising, replacing the gate structure with a replacement metal gate structure subsequent to forming the lower and upper source/drain regions.

7. The method of claim 1, further comprising removing the gate structure from the semiconductor structure and thereafter removing the intermediate layer from the layer stack by etching the second material selectively from the first and the third materials.

8. The method of claim 1, wherein the lower channel layer and the lower source/drain regions form part of a lower transistor, and wherein the upper channel layer and the upper source/drain regions form part of an upper transistor.

9. The method of claim 1, wherein the Ge-content of the third material is at least 10 percent greater than the Ge-content of the first material, and wherein the Ge-content of the second material is at least 10 percent greater than the Ge-content of the third material.

10. The method of claim 9, wherein the first material is Si.

11. The method of claim 1, wherein the layer stack is formed by a stack of nanowires or by a stack of nanosheets.

12. The method of claim 1, wherein forming the semiconductor structure comprises performing a fin cut process to a semiconductor fin structure such that the portion of the semiconductor fin structure under the gate structure remains.

13. A method of forming a semiconductor device, the method comprising:

forming a layer stack over a substrate and a gate structure over the layer stack, wherein the layer stack comprises a lower channel layer formed of a first material, an intermediate layer formed of a second material and an upper channel layer formed of a third material, wherein the first, second, and third materials have different germanium (Ge) concentrations;

depositing first spacers on opposing ends of the intermediate layer;

oxidizing opposing end portions of the upper channel layer to form second spacers and oxidizing opposing end portions of the lower channel layer, wherein thicknesses of oxidized end portions of the lower channel layer are greater than thicknesses of oxidized end portions of the upper channel layer; and removing the oxidized end portions of the lower channel layer while leaving at least a portion of the second spacers of the upper channel layer.

14. The method of claim 13, further comprising etching back end surfaces of the intermediate layer exposed at opposite sides of the gate structure to form recesses in the semiconductor structure at opposite sides of the gate structure, wherein depositing the first spacers comprises depositing the first spacers in the recesses.

15. The method of claim 13, wherein the first material comprises $SiGe_x$, the second material comprises $SiGe_y$, and the third material comprises $SiGe_z$, wherein $0 \leq x < z < y$.

16. The method of claim 13, further comprising epitaxially growing lower source/drain regions on end surfaces of the lower channel layer exposed at opposite sides of the gate structure.

17. The method of claim 16, further comprising removing the second spacers to expose the end surfaces of the upper channel layer.

18. The method of claim 17, further comprising epitaxially growing upper source/drain regions on the end surfaces of the upper channel layer, subsequent to removing the second spacers to expose the end surfaces of the upper channel layer and while the first spacers cover the intermediate layer end surfaces.

19. The method of claim 18, further comprising:

forming lower source/drain contacts for the lower source/drain regions and/or forming upper source/drain contacts for the upper source/drain regions prior to epitaxially growing the upper source/drain regions; and forming an insulating capping layer on at least one of the lower source/drain contacts prior to forming the upper source/drain contacts.

* * * * *